United States Patent
Sakai et al.

[11] Patent Number: 5,856,204
[45] Date of Patent: Jan. 5, 1999

[54] TUNNEL-TYPE JOSEPHSON ELEMENT AND METHOD FOR MANUFACTURING THE SAME

[75] Inventors: Masahiro Sakai, Osaka; Hidetaka Higashino, Kyoto; Hideaki Adachi; Kentaro Setsune, both of Osaka, all of Japan

[73] Assignee: Matsushita Electric Industrial Co., Ltd., Osaka, Japan

[21] Appl. No.: 721,976

[22] Filed: Sep. 27, 1996

[30] Foreign Application Priority Data

Sep. 28, 1995 [JP] Japan .................................. 7-251228
Jan. 26, 1996 [JP] Japan .................................. 8-011428

[51] Int. Cl.⁶ .................................................. H01L 21/00
[52] U.S. Cl. ............................................. 438/2; 501/329
[58] Field of Search .................................. 438/2; 501/329

[56] References Cited

U.S. PATENT DOCUMENTS

| | | | |
|---|---|---|---|
| 5,206,213 | 4/1993 | Cuomo et al. | 505/1 |
| 5,378,683 | 1/1995 | Cabanel et al. | 505/190 |
| 5,430,011 | 7/1995 | Tanaka et al. | 505/193 |
| 5,462,919 | 10/1995 | Tanaka et al. | 505/410 |
| 5,504,058 | 4/1996 | Tanaka et al. | 505/190 |
| 5,629,267 | 5/1997 | Ikegawa et al. | 505/218 |
| 5,677,264 | 10/1997 | Suh et al. | 505/329 |
| 5,683,968 | 11/1997 | Nakamura et al. | 505/329 |
| 5,717,222 | 2/1998 | Nakamura et al. | 257/38 |

FOREIGN PATENT DOCUMENTS

| | | |
|---|---|---|
| 3-153089 | 7/1991 | Japan . |
| 4-144913 | 5/1992 | Japan . |
| 5-279192 | 10/1993 | Japan . |
| 5343757 | 12/1993 | Japan . |
| 7-58366 | 3/1995 | Japan . |
| 7-74401 | 3/1995 | Japan . |

OTHER PUBLICATIONS

Paul Muller, "New Thin Film Devices", The 1995 International Workshop on Superconductivity Co–Sponsored by ISTEc and MRS, pp. 29–32, Jun. 18–21, 1996.

R. Kleiner and P. Muller, "Intrinsic Josephson effects in high $T_c$ superconductors", Physical Review B vol. 49, No. 2, 1994, pp. 1327–1341 Month Unknown.

*Primary Examiner*—David Graybill
*Assistant Examiner*—Michael S. Lebentritt
*Attorney, Agent, or Firm*—McDermott, Will & Emery

[57] ABSTRACT

A plurality of single crystal grains made of $Bi_2Sr_2Ca_1Cu_2O_8$ which are heat treated at a temperature that is equal to or higher than the crystallization temperature of an oxide high-temperature superconductor made of $Bi_2Sr_2Ca_1Cu_2O_8$ and are surrounded by a grain boundary are formed on a substrate made of a MgO single crystal. A convex portion having a sectional area of 400 $\mu m^2$ or less and a height which is equal to or less than ten times as much as a space between block layers of $Bi_2Sr_2Ca_1Cu_2O_8$ is formed on the upper face portion of the single crystal grain. A first electrode made of Au is formed on the upper face of the convex portion of the single crystal grain, and a second electrode is formed in a region other than the convex portion in the single crystal grain. The first electrode is insulated from the second electrode by an insulating film made of $CaF_2$.

14 Claims, 14 Drawing Sheets

TUNNEL-TYPE JOSEPHSON ELEMENT AND METHOD FOR MANUFACTURING THE SAME

BACKGROUND OF THE INVENTION

The present invention relates to a thin film element and a method for manufacturing the thin film element, and more particularly to a tunnel-type Josephson thin film element which can be applied to high frequency communication and a logic circuit and utilizes the intrinsic Josephson junction of an oxide high-temperature superconductor, and a method for manufacturing the tunnel-type Josephson thin film element.

Recently, thin film elements having various functions have been made for practical use with the development of the thin film forming technique. As thin film elements using oxide thin films, an infrared ray sensor which utilizes pyroelectric properties of a lead titanate based thin film, a surface acoustic wave filter which utilizes piezoelectric properties of a zinc oxide thin film, and the like have been made for practical use, for example. Referring to these thin film elements, the standard of crystallization of the thin film which is required to become an element is not high. In addition, since the thin film element has a simple crystalline structure, it can easily be formed into a thin film having the crystalline properties which are necessary. For these reasons, the thin film element has been made for practical use without lots of difficulty.

In an element which utilizes the great anisotropy of crystals, however, the characteristics of the element is highly influenced by the disturbance of small crystalline properties (the orientation of crystals). Consequently, a thin film having great crystalline properties is required. For example, when a very thin insulating layer is interposed between two superconductors, the tunnel effect of an electron pair is generated between the superconductors. Consequently, even though a voltage is not applied from the outside, a superconductive current flows through the thin insulating layer. Thus, a tunnel-type Josephson element is obtained. Actually, it has been hard to manufacture the tunnel-type Josephson element in which a thin oxide insulating layer is interposed between oxide high-temperature superconductors because the coherence length of a superconductive electron pair is very small.

Recently, it has become apparent that the two-dimensional crystalline structure of the oxide high-temperature superconductor essentially forms a Josephson junction, that is, an intrinsic Josephson junction. Japanese Unexamined Patent Publication No. 7-58366 has also proposed a method for manufacturing a tunnel-type Josephson element as a thin film element which is made of the oxide high-temperature superconductor.

A method for manufacturing a tunnel-type Josephson element according to the prior art will be described below with reference to the drawings.

FIGS. 13 (a) to 13 (e) are sectional views showing, in order of steps, the method for manufacturing a tunnel-type Josephson element according to the prior art. The method for manufacturing a tunnel-type Josephson element will briefly be described sequentially. First of all, a first superconductor thin film 102 having a thickness of about 100 nm is formed on a substrate 101 and a photoresist pattern 103 is then formed selectively on the upper face of the first superconductor thin film 102 as shown in FIG. 13 (a).

By using the photoresist pattern 103 as a mask, the first superconductor thin film 102 is etched, for example, by 10 nm as shown in FIG. 13 (b).

As shown in FIG. 13 (c), a layer insulating film 104 is deposited over the whole face of the substrate 101 to the same extent as the amount of etching.

As shown in FIG. 13 (d), the photoresist pattern 103 is lifted off to remove the layer insulating film 104 on the photoresist pattern 103. Then, the surface covered with the photoresist pattern 103 on the first superconductor thin film 102 is cleaned by oxygen ion beams. Thereafter, a second superconductor thin film 105 having a thickness of about 150 nm is deposited over the whole face of the substrate 101 with a vacuum kept. Subsequently, the second superconductor thin film 105 is etched so as to have a width of 100 $\mu$m as shown in FIG. 13 (e).

In the method for manufacturing a tunnel-type Josephson element according to the prior art, however, the crystalline properties of a junction region 102a which is an interface between the first superconductor thin film 102 and the second superconductor thin film 105 that is shown in FIG. 13 (e) become poorer. More specifically, the layer structure of a crystal is not held over the junction region 102a but becomes partially discontinuous at the atomic level as shown in a plan view of FIG. 14 (b) which is an enlarged view showing the junction region 102a in FIG. 13 (e) and in FIG. 14 (a) showing a sectional structure taken along the line XIV—XIV in FIG. 14 (b). In some cases, consequently, electric insulation is not sufficiently performed by a high resistive layer (block layer) in the layer structure of the crystal. Therefore, top and bottom low resistive layers (in the c-axis direction) are electrically connected in the layer structure of the crystal so that tunnel junction characteristics cannot be obtained.

The junction region 102a shown in FIG. 13 (d) is formed by the fine processing technique. For this reason, when forming the first superconductor thin film 102, it is necessary to obtain a single crystal region having a size which can be processed by at least the current fine processing technique (about 1 $\mu$m or more) so as to be easily distinguished from other regions. In the current thin film forming technique, however, it is hard to obtain the single crystal region which meets such a condition.

Furthermore, the steps of forming a first thin film, performing fine processing, and forming a second thin film are necessary when forming the junction region 102a. Therefore, impurities such as water molecules easily adhere to the junction region 102a, for example. Accordingly, when the impurities adhere to a c-axis orientation film in the oxide high-temperature superconductor having an intrinsic Josephson junction in which a superconductive layer and an insulating layer are alternately oriented, two or more insulating layers are newly laminated on the insulating layer so that the tunnel junction characteristics cannot be obtained. Thus, when completely forming the superconductor thin film by performing processing plural times, it is difficult to obtain a junction of good quality.

According to the method proposed in the Japanese Unexamined Patent Publication No. 7-58366, thus, it is impossible to manufacture a tunnel-type Josephson thin film element having substantially excellent element characteristics.

SUMMARY OF THE INVENTION

In order to solve the above-mentioned problems according to the prior art, it is an object of the present invention to provide a tunnel-type Josephson element which utilizes the intrinsic Josephson junction of an oxide high-temperature superconductor and a method for manufacturing the tunnel-type Josephson element.

In order to accomplish the above-mentioned object, the present invention is characterized in that a thin film made of an oxide high-temperature superconductor is formed on the main face of a substrate, and the thin film is heat treated at a temperature which is equal to or higher than the crystallization temperature of the oxide high-temperature superconductor so that a single crystal grain having c-axis orientation is formed in the thin film, a first electrode is then formed on the upper face of the single crystal grain, and a second electrode is formed in a region on the main face of the substrate other than a region where the single crystal grain is formed.

The present invention provides a tunnel-type Josephson element, comprising a conductive region which is formed on a substrate, a single crystal grain which is provided on the conductive region and is formed by heat treating an oxide high-temperature superconductor at a temperature that is equal to or higher than the crystallization temperature of the oxide high-temperature superconductor, a first electrode which is electrically connected to a face on the opposite side to the conductive region in the single crystal grain, and a second electrode which is electrically connected to a region other than a region on the conductive region where the single crystal grain is formed, wherein the single crystal grain is formed so as to have the tunnel-type Josephson effect.

According to the tunnel-type Josephson element, the single crystal grain made of the oxide high-temperature superconductor which produces the tunnel-type Josephson effect and is formed in the direction of a crystal axis is formed in the conductive region on the substrate by heat treatment at the temperature which is equal to or higher than the crystallization temperature of the oxide high-temperature superconductor. Therefore, the first electrode which is electrically connected to the face on the opposite side to the conductive region and the second electrode which is electrically connected through the conductive region are provided so that the anisotropic electric characteristics of crystals which show crystal axis anisotropy can be kept stably. Consequently, the thin film element having the tunnel-type Josephson effect shows excellent element characteristics.

The crystallization temperature means a temperature at which a compound starts to be crystallized. In prior arts, it has been supposed that the thin film formed on the substrate which is heat treated at the temperature that is equal to or higher than the crystallization temperature of the compound forming the thin film cannot be utilized for an electronic element because the crystalline properties of each crystal grain of the compound forming the thin film are enhanced but a lot of grain boundaries are generated in the thin film. However, the present inventors have found that the compound having the crystal axis anisotropy in the thin film grows into a single crystal grain having a size which can be processed by the fine processing technique (grain diameter: about 1 $\mu$m or more) and the single crystal grain is oriented in some direction with respect to the main face of the substrate when the thin film of the compound in which a crystal has anisotropy is heat treated at the temperature which is equal to or higher than the crystallization temperature of the compound. On the basis of this knowledge, the thin film element can be implemented with a structure where the direction in which the crystal face having the single crystal grain obtained by the heat treatment is traversed is set to the current direction.

In the tunnel-type Josephson element, it is preferable that a sectional area, in the direction perpendicular to the c-axis direction, of the region which produces the tunnel-type Josephson effect in the single crystal grain should be 400 $\mu$m$^2$ or less. Thus, a voltage value obtained when a current which exceeds a Josephson critical current is generated so that the element jumps to the voltage state can be restricted to a value which is equal to or smaller than a tunnel voltage determined by the number of intrinsic Josephson junctions. Consequently, it is possible to control heat generated when the element jumps to the voltage state during the operation of the element. Thus, the operation of the element can be stabilized.

In the tunnel-type Josephson element, it is preferable that the length, in the c-axis direction, of the region which produces the tunnel-type Josephson effect in the single crystal grain should be equal to or less than ten times as much as a space between block layers of the oxide high-temperature superconductor. Thus, the length, in the c-axis direction, of the region which produces the tunnel-type Josephson effect is equal to or less than ten times as much as the space between the block layers of the oxide high-temperature superconductor. Consequently, the thickness of the single crystal grain is also set equal to or less than 10 times as much as the space between the block layers of the oxide high-temperature superconductor. Therefore, the number of junctions which are operated as the intrinsic Josephson junction can be restricted to 10 or less. As a result, a voltage necessary for the operation of the element can be set to several hundreds mV or less. Thus, the consumed power of the Josephson element can be reduced and the stable operation can be implemented.

In the tunnel-type Josephson element, it is preferable that the oxide high-temperature superconductor should be a compound which contains Bi (bismuth), Sr (strontium), Ca (calcium), Cu (copper) and O (oxygen). Thus, the single crystal grain having excellent crystalline properties can be obtained because a Bi based superconductor having great crystal axis anisotropy is used as the oxide high-temperature superconductor. Accordingly, the intrinsic Josephson junction can surely be formed so that the operation can become more stable.

The present invention provides a method for manufacturing a tunnel-type Josephson element, comprising the steps of forming a thin film made of an oxide high-temperature superconductor on the main face of a substrate, forming a single crystal grain which is made of the oxide high-temperature superconductor and has the c-axis orientation by heat treating the thin film at a temperature that is equal to or higher than the crystallization temperature of the oxide high-temperature superconductor, forming a first electrode which is electrically connected to the single crystal grain in a region on the upper face of the thin film, and forming a second electrode which is electrically connected to the single crystal grain in the other region on the upper face of the thin film.

According to the method for manufacturing a tunnel-type Josephson element, the thin film made of the oxide high-temperature superconductor which is formed on the main face of the substrate is heat treated at the temperature which is equal to or higher than the crystallization temperature of the oxide high-temperature superconductor to form, in the thin film, the single crystal grain which is made of the oxide high-temperature superconductor and has c-axis orientation. Accordingly, the first electrode which is electrically connected to the upper face portion of the single crystal grain can be formed in the region on the upper face of the thin film, and the second electrode can be formed in the region other than the region where the first electrode is formed. Thus, the second electrode is electrically connected to the lower side portion of the single crystal grain of the thin film. Consequently, the anisotropic electric characteristics of the crystal which show the crystal axis anisotropy are kept stably. Thus, it is possible to manufacture the Josephson element having excellent element characteristics.

The present invention provides a method for manufacturing a tunnel-type Josephson element, comprising the steps of forming a thin film made of an oxide high-temperature superconductor on the main face of a substrate, forming a first electrode in a region on the upper face of the thin film, forming a second electrode in the other region on the upper face of the thin film, and forming a single crystal grain which is made of the oxide high-temperature superconductor and has the c-axis orientation by heat treating the thin film at a temperature that is equal to or higher than the crystallization temperature of the oxide high-temperature superconductor.

According to the method for manufacturing a tunnel-type Josephson element, the thin film made of the oxide high-temperature superconductor which is formed on the main face of the substrate is heat treated at the temperature which is equal to or higher than the crystallization temperature of the oxide high-temperature superconductor to form, in the thin film, the single crystal grain which is made of the oxide high-temperature superconductor and has c-axis orientation. Accordingly, the first electrode which is electrically connected to the upper face portion of the single crystal grain can be formed in the region on the upper face of the thin film, and the second electrode which is formed in the region other than the region where the first electrode is formed is electrically connected to the lower side portion of the single crystal grain of the thin film. Consequently, the anisotropic electric characteristics of the crystal which show the crystal axis anisotropy are kept stably. Thus, it is possible to manufacture the Josephson element having excellent element characteristics.

It is preferable that the method for manufacturing a tunnel-type Josephson element should further comprise, between the single crystal grain forming step and the first electrode forming step, the step of forming a convex portion made of a predetermined region on the upper face portion of the single crystal grain by removing a region other than the predetermined region on the upper face portion of the single crystal grain to a predetermined depth with respect to the main face of the substrate, that the first electrode forming step should include the step of forming the first electrode on the upper face of the convex portion of the single crystal grain, and that the second electrode forming step should include the step of forming the second electrode in a region other than the convex portion of the single crystal grain.

Thus, the first electrode is formed on the upper face of the convex portion which is a substantial element formation region, and the second electrode is formed in the region other than the convex portion of the single crystal grain. Consequently, the region other than the convex portion can be used for the conductive region where the convex portion of the single crystal grain which is the element formation region is operated. Accordingly, the second electrode is formed in the region other than the convex portion so that the second electrode is electrically connected to the lower side portion of the convex portion of the single crystal grain. Consequently, the electric characteristics of the single crystal grain in the c-axis direction can be fetched as an element. Thus, the intrinsic Josephson junction of the single crystal grain made of the oxide high-temperature superconductor can be utilized surely.

The oxide high-temperature superconductor is the c-axis orientation film within the generally wide temperature range. The critical current density in the c-axis direction is much smaller than a critical current density in the direction parallel with an ab face. Accordingly, the electrodes are connected to the upper face of the convex portion and the exposed surface respectively in such a manner that the direction perpendicular to the substrate in the convex portion (the c-axis direction) is the current direction. Consequently, the convex portion is operated as a substantial element portion. Furthermore, it can be supposed that the region other than the convex portion of the single crystal grain is a channel which acts as a simple conductive region.

In the method for manufacturing a tunnel-type Josephson element, it is preferable that the upper face of the convex portion of the single crystal grain should have an area of 400 $\mu m^2$ or less. Thus, a voltage value obtained when a current which exceeds the Josephson critical current is generated so that the element jumps to the voltage state can be restricted to a value which is equal to or smaller than a tunnel voltage determined by the number of intrinsic Josephson junctions. Consequently, it is possible to control heat generated when the element jumps to the voltage state during the operation of the element. Thus, it is possible to manufacture the Josephson element which can be operated stably.

In the method for manufacturing a tunnel-type Josephson element, it is preferable that the height of the convex portion of the single crystal grain should be equal to or less than 10 times as much as a space between block layers of the oxide high-temperature superconductor formed at the superconductor thin film forming step. Thus, the height of the convex portion on the upper face of the single crystal grain is equal to or less than ten times as much as the space between the block layers of the oxide high-temperature superconductor. Consequently, the thickness of the single crystal grain is also set equal to or less than 10 times as much as the space between the block layers of the oxide high-temperature superconductor. Therefore, the number of junctions which are operated as the intrinsic Josephson junction can be restricted to 10 or less. As a result, a voltage necessary for the operation of the element can be set to several hundreds mV or less. Thus, the consumed power of the Josephson element can be reduced and the stable operation can be implemented.

It is preferable that the method for manufacturing a tunnel-type Josephson element should further comprise, between the single crystal grain forming step and the first electrode forming step, the step of forming a frame-shaped concave groove having a predetermined depth on the upper face portion of the single crystal grain to divide the upper face of the single crystal grain into a first region surrounded by the concave groove and a second region on the outside of the concave groove, that the first electrode forming step should include the step of forming the first electrode in the first region of the single crystal grain, and that the second electrode forming step should include the step of forming the second electrode in the second region of the single crystal grain.

Thus, the area of the second region is set greater than that of the first region by one digit or more. Consequently, the critical current value of the junction in the c-axis direction in the first region which acts as the element formation region becomes smaller than the critical current value of the junction in the c-axis direction in the second region by one digit or more. Accordingly, the second region can be used as a conductive region where the first region which acts as the element formation region is operated. Consequently, the second electrode is formed in the second region so that it is electrically connected to the lower side portion of the first region. Therefore, the electric characteristics of the first region in the c-axis direction can be fetched as an element. As a result, it is possible to surely utilize the intrinsic Josephson junction of the single crystal grain made of the oxide high-temperature superconductor.

It is preferable that the method for manufacturing a tunnel-type Josephson element should further comprise, prior to the superconductor thin film forming step, the step of forming a frame-shaped concave groove having a predetermined depth on the main face portion of the substrate to divide the main face portion of the substrate into a first region surrounded by the concave groove and a second region on the outside of the concave groove, that the superconductor thin film forming step should include the step of forming, over the whole main face of the substrate, a thin film made of an oxide high-temperature superconductor having a thickness which is greater than the predetermined depth of the concave groove, that the first electrode forming step should include the step of forming the first electrode in the upper side portion of the first region of the substrate in the thin film, and that the second electrode forming step should include the step of forming the second electrode in the upper side portion of the second region of the substrate in the thin film.

Thus, the thin film made of the oxide high-temperature superconductor is formed on the main face of the substrate in which the element formation region is partitioned by the frame-shaped concave groove so that the element formation region in the thin film is also partitioned by the frame-shaped concave groove formed on the thin film. Consequently, it is unnecessary to perform the process for etching the thin film. As a result, the thin film is not damaged by etching. Therefore, the yield of the Josephson element can be enhanced.

Furthermore, the thin film is heat treated to orient, in the c-axis direction, the element formation region which is partitioned by the concave groove in the thin film to become one single crystal grain, oriented in the c-axis direction. Therefore, it is possible to obtain the single crystal grain made of the oxide high-temperature superconductor having excellent crystalline properties in the element formation region. Consequently, it is possible to manufacture the Josephson element which is operated stably.

In addition, the position where the single crystal grain is to be formed can be controlled by the concave groove formed on the main face of the substrate. Consequently, it is unnecessary to perform the working of specifying the position of the single crystal grain by a stereomicroscope. Thus, it is possible to implement the manufacturing method suitable for industrialization.

Moreover, the thickness of the thin film made of the oxide high-temperature superconductor is greater than the depth of the concave groove formed on the substrate. Consequently, the thin film which is formed integrally with the thin film of the second region is present on the lower side of the single crystal grain which is formed in the first region. Accordingly, when the second electrode which is to be connected to the second region of the thin film is formed, the second electrode is electrically connected to the lower side portion of the single crystal grain of the thin film. As a result, it is possible to surely utilize the intrinsic Josephson junction of the single crystal grain made of the oxide high-temperature superconductor.

It is preferable that the method for manufacturing a tunnel-type Josephson element should further comprise, prior to the superconductor thin film forming step, the step of forming a slant portion which divides the main face portion of the substrate into a first plane portion and a second plane portion, has an angle of 15° to 75° to the main face of the substrate between the first and second plane portions, and connects the first and second plane portions, that the superconductor thin film forming step should include the step of forming, over the whole main face of the substrate, a thin film made of an oxide high-temperature superconductor which has a thickness that is smaller than the height of the slant portion, that the single crystal grain forming step should include the step of forming the single crystal grain in a region having the upper side portion of the slant portion of the substrate in the thin film, and then forming a band-shaped portion made of the single crystal grain on the slant portion of the single crystal grain in the direction of inclination of the slant portion, that the first electrode forming step should include the step of forming, on the first plane portion, the first electrode which is electrically connected to the first plane portion in the single crystal grain, and that the second electrode forming step should include the step of forming, on the second plane portion, the second electrode which is electrically connected to the second plane portion in the single crystal grain.

Thus, if the upper stage side of the slant portion is the first plane portion and the lower stage side of the slant portion is the second plane portion, the second electrode formed on the second plane portion is formed in a region including the slant portion and is electrically connected to the lower side portion of the single crystal grain which acts as a substantial element formation region. Consequently, the electric characteristics in the c-axis direction can be fetched as an element. Thus, it is possible to surely utilize the intrinsic Josephson junction of the single crystal grain made of the oxide high-temperature superconductor.

Furthermore, the growth of the single crystal grain is promoted in the vicinity of the slant portion at the single crystal grain forming step. Consequently, it is not necessary to perform heat treatment in such a manner that a grain boundary is definitely generated in the thin film. As a result, manufacture can easily be performed.

In the method for manufacturing a tunnel-type Josephson element, it is preferable that the oxide high-temperature superconductor at the superconductor thin film forming step should be a compound which contains Bi (bismuth), Sr (strontium), Ca (calcium), Cu (copper) and O (oxygen). Thus, since a Bi based superconductor having great crystal axis anisotropy is used as the oxide high-temperature superconductor, the single crystal grain having excellent crystalline properties can be obtained. Consequently, the intrinsic Josephson junction can surely be formed. As a result, it is possible to manufacture the Josephson element which is operated more stably.

As described above, it is possible to easily and surely manufacture the tunnel-type Josephson element which uses the intrinsic Josephson junction of the oxide high-temperature superconductor. This element is widely utilized for a Josephson computer, a digital circuit, a superconducting quantum interference device (SQUID), a mixer for detecting electromagnetic waves in a millimeter wave region or in a far infrared region. Therefore, the value of the present invention is very great in the industry.

BRIEF DESCRIPTION OF THE DRAWINGS

The present invention will be detailed in conjunction with the accompanying drawings wherein.

DETAILED DESCRIPTION OF THE INVENTION

Preferred embodiments of the present invention will be described below with reference to the drawings. While a tunnel-type Josephson element in which a Bi (bismuth) based high-temperature superconductor is used for a compound having c-axis anisotropy will be described in each embodiment, the present invention can be widely applied to the case where a thin film made of a compound having crystal axis anisotropy is made into an element.
(First Embodiment)

Figure 1:
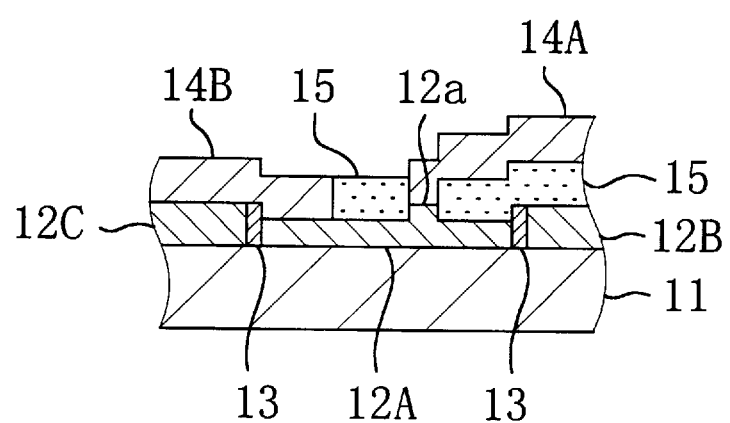
FIG. 1 is a sectional view showing a tunnel-type Josephson element according to a first embodiment of the present invention.

FIG. 1 is a sectional view showing a tunnel-type Josephson element according to a first embodiment of the present invention. In FIG. 1, a plurality of single crystal grains 12A, 12B, 12C, . . . made of $Bi_2Sr_2Ca_1Cu_2O_8$ which are heat treated at a temperature that is equal to or higher than the crystallization temperature of an oxide high-temperature superconductor made of $Bi_2Sr_2Ca_1Cu_2O_8$ and are surrounded by a grain boundary 13 are formed on a substrate 11 made of a MgO single crystal. A convex portion 12a is formed on the upper face portion of the single crystal grain 12A. The convex portion 12a has a sectional area of 400 $\mu m^2$ or less and a height which is equal to or less than 10 times as much as a space (15 nm) between $Bi_2Sr_2Ca_1Cu_2O_8$ block layers. A first electrode 14A made of Au (gold) is formed on the upper face of the convex portion 12a of the single crystal grain 12A. A second electrode 14B to be a conductive channel is formed in a conductive region other than the convex portion 12a of the single crystal grain 12A. The reference numeral 15 designates an insulating film made of $CaF_2$ (calcium fluoride) which is formed on the single crystal grains 12A and 12B, insulates the first electrode 14A from the single crystal grains 12A and 12B, and insulates the first electrode 14A from the second electrode 14B.

Thus, the convex portion 12a which has a sectional area of 400 $\mu m^2$ or less and has a height that is equal to or less than 10 times as much as the space between the block layers of the oxide high-temperature superconductor is formed on the upper face of the single crystal 12A which is formed on the substrate 11 and heat treated at a temperature that is equal to or higher than the crystallization temperature of the oxide high-temperature superconductor. In addition, the first electrode 14A which is electrically connected to a face on the opposite side to the conductive channel is provided, and the second electrode 14B which acts as the conductive channel is formed in a region other than the convex portion 12a of the single crystal grain 12A. Consequently, since the second electrode 14B is electrically connected to the lower side portion of the convex portion 12a of the single crystal grain 12A, the electric characteristics of the convex portion 12a in the c-axis direction can be fetched as an element. Accordingly, a thin film element having the tunnel-type Josephson effect can be implemented.

Furthermore, the sectional area of the convex portion 12a of the single crystal grain 12A which is a substantial element portion is set to 400 $\mu m^2$ or less. Therefore, a voltage value which is obtained when the element jumps to the voltage state by a current that exceeds a Josephson critical current can be restricted to a value which is equal to or smaller than a tunnel voltage determined by the number of intrinsic Josephson junctions. Consequently, it is possible to control Joule heat which is generated when the element is operated to jump to the voltage state. As a result, an element which is operated stably can be implemented.

The height of the convex portion 12a of the single crystal grain 12A is 10 times as much as the space between the block layers of the oxide high-temperature superconductor or less. Therefore, the number of junction portions which are operated as the intrinsic Josephson junction can be restricted to 10 or less. Consequently, a voltage necessary for the operation of the element can be set to several hundreds mV or less. Thus, it is possible to control the unstable operation of the Josephson element caused by the Joule heat and to reduce the consumed power thereof.

Figure 2:
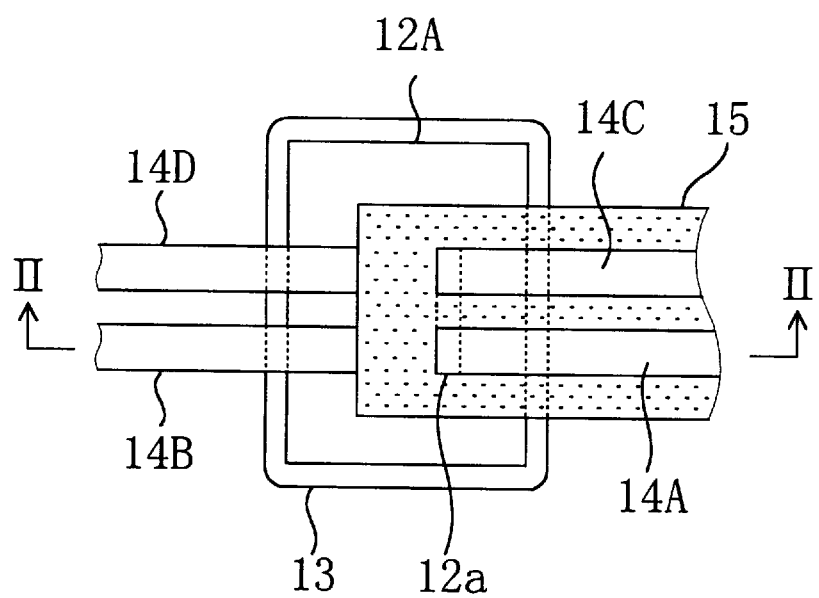
FIG. 2 is a partial plan view showing the tunnel-type Josephson element according to the first embodiment of the present invention.
Figure 3A:
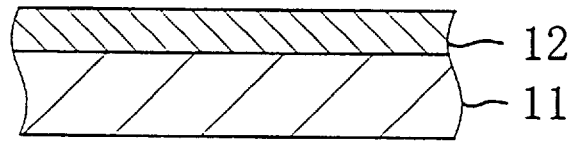
FIGS. 3 (a) to 3 (d) are sectional views showing, in order of steps, a method for manufacturing the tunnel-type Josephson element according to the first embodiment of the present invention.
Figure 3B:
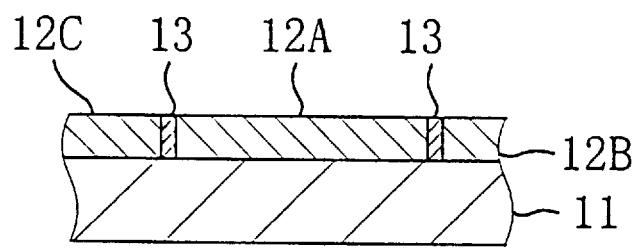
Figure 3C:
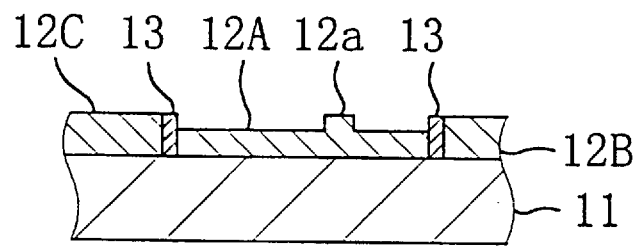
Figure 3D:
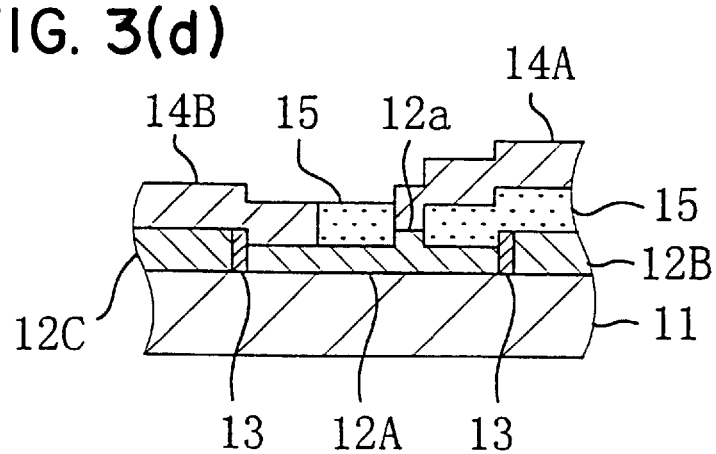

FIG. 2 is a partial plan view showing the tunnel-type Josephson element according to the present embodiment. FIG. 1 shows a sectional structure taken along the line II—II in FIG. 2. In FIG. 2, the same reference numerals designate the same or corresponding portions as in FIG. 1. For convenience, a crystal boundary 13 is a square, but is actually a polygon having the concavo-convex shape. As shown in FIG. 2, a third electrode 14C having the same shape as that of the first electrode 14A and a fourth electrode 14D having the same shape as that of the second electrode 14B are formed respectively in such a manner that 4-terminal measurement can be performed. For example, a current is caused to flow between the first and second electrodes 14A and 14B so that a voltage between the third and fourth electrodes 14C and 14D can be measured. Four terminals are not always necessary for the element.

A method for manufacturing the tunnel-type Josephson element according to the first embodiment of the present invention will be described below with reference to the drawings.

FIGS. 3 (a) to 3 (d) are sectional views showing, in order of steps, a method for manufacturing the tunnel-type Josephson element according to the first embodiment of the present invention. As shown in FIG. 3 (a), Bi-Sr-Ca-Cu-O having a composition of Bi:Sr:Ca:Cu=2.1:2:1:2 is used as a target to form, by a radiofrequency magnetron sputtering method, a thin film 12 made of $Bi_2Sr_2Ca_1Cu_2O_8$ which has a thickness of about 200 nm on a face (100) of a substrate 11 made of a MgO single crystal which is heated to 600° C. In this case, a mixed gas of argon and oxygen is used as an atmospheric gas. The mixing ratio is $Ar/O_2=90/10$. A gas pressure is 1.0 Pa during film formation. In general, a substrate temperature which is almost 800° C. is required in order to obtain the thin film 12 made of $Bi_2Sr_2Ca_1Cu_2O_8$ having good crystalline properties. Therefore, the crystalline properties of the thin film 12 formed at a substrate temperature of 600° C. are not very good. However, it was found that great single crystal grains can be obtained by forming the thin film 12 at a substrate temperature of 600° C. and performing heat treatment which will be described below. Therefore, 600° C. is employed as the substrate temperature when forming the thin film 12. It is hard to determine the amount of oxygen of an oxide high-temperature superconductive thin film. For this reason, the amount of oxygen of the thin film112 has not actually been confirmed.

The film forming method, and the conditions for film formation such as the substrate temperature, the gas ratio of the mixed gas, the gas pressure and the like can properly be varied within the range where the composition of the formed thin film 12 approximates $Bi_2Sr_2Ca_1Cu_2O_8$.

In order to cause the single crystal grains 12A, 12B, 12C, . . . to grow in the thin film 12 made of $Bi_2Sr_2Ca_1Cu_2O_8$ as shown in FIG. 3 (b), the thin film 12 was heat treated for 24 hours at a temperature of 870° C. in an oxygen atmosphere, for example. The thin film 12 which had been heat treated was measured by X-ray diffraction. As a result of measurement, it was found that the thin film 12 is a c-axis orientation film (which is perpendicular to the surface of the substrate 11) that is crystallized very highly and includes $Bi_2Sr_2Ca_1Cu_2O_8$ as a main component and $Bi_2Sr_2Cu_1O_6$ as an auxiliary component. Furthermore, it was found that a lot of single crystal grains 12A, 12B, 12C, . . . having a diameter of 10 μm or more and a grain boundary 13 are present by performing observation using a scanning electron microscope. In addition, it was confirmed, based on the result of energy distribution type X-ray spectroscopic measurement, that the composition of the crystal grains is $Bi_2Sr_2Ca_1Cu_2O_8$, the crystal grains are single crystal grains which are oriented in the c-axis direction and a $Bi_2Sr_2Cu_1O_6$ phase is present in the grain boundary 13 portion.

By measuring the electric resistance temperature dependency of the single crystal grain 12A and the like, it was found that the onset of superconductive transfer is about 80K and a zero resistance temperature is 40K. It can be presumed that the transfer is broad because measurement indicates characteristics including the grain boundary portion and that the onset is lower than 90K because the single crystal grain 12A and the like are in an overdoped region by heat treatment in the oxygen atmosphere.

As shown in FIG. 3 (c), the convex portion 12a having a size of 2 μm×5 μm is left in the upper face portion of the single crystal grain 12A, and the upper face portion of the single crystal grain 12A other than the convex portion 12a is removed by a depth of about 10 nm, for example. At this time, the grain boundary 13 has greatly grown by the long-time heat treatment at the above-mentioned step in such a manner that it can be visually observed easily by a stereomicroscope. Therefore, it is easy to specify the single crystal grain 12A.

As shown in FIG. 3 (d), a first electrode 14A made of Au is formed on the upper face of the convex portion 12a, and a second electrode 14B made of Au is formed in a region other than the convex portion 12a of the single crystal grain 12A. In addition, an insulating film 15 made of $CaF_2$ which insulates the electrodes from each other or insulates the first electrode 14A from the single crystal grain 12A is formed. As shown in FIG. 2, a third electrode 14C and a fourth electrode 14D are also formed at the same time in such a manner that 4-terminal measurement can be performed.

According to the above-mentioned structure, an electric resistance is small in the direction of an ab face of the single crystal grain 12A (which is parallel with the surface of the substrate 11). Consequently, the second electrode 14B is electrically connected to the lower side portion of the convex portion 12a of the single crystal grain 12A. Thus, the electric characteristics of the single crystal grain 12A in the c-axis direction can be utilized as an element.

Figure 4:
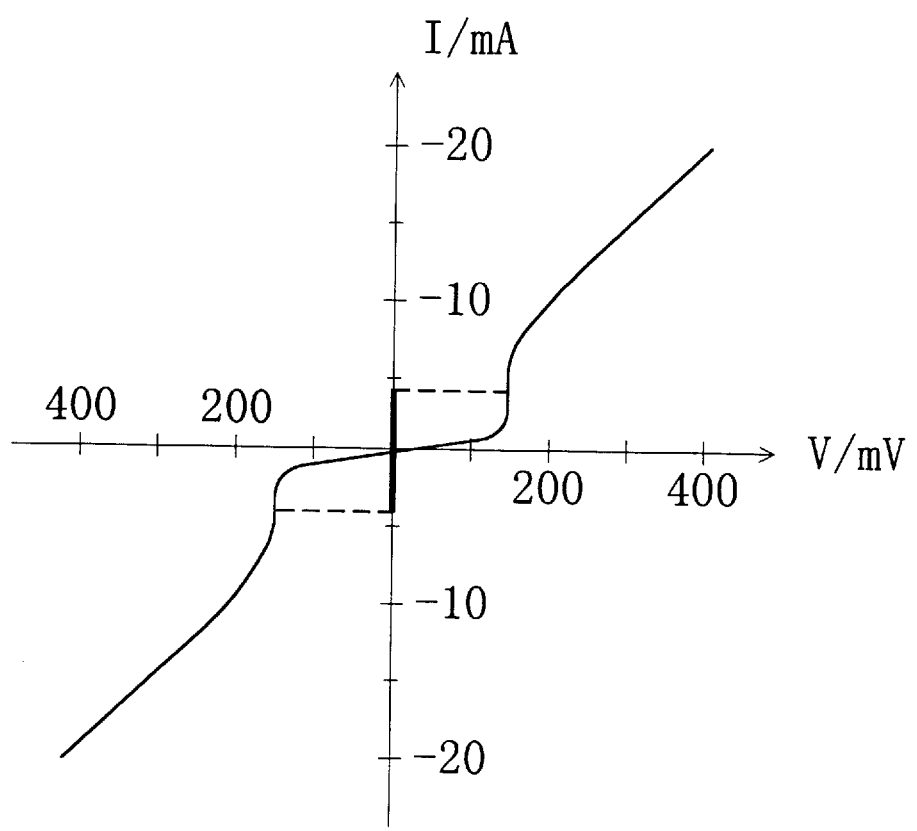
FIG. 4 is a chart showing the current-voltage characteristics of the tunnel-type Josephson element according to the first embodiment of the present invention.
Figure 5A:
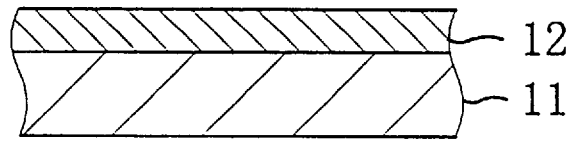
FIGS. 5 (a) to 5 (d) are sectional views showing, in order of steps, a method for manufacturing a tunnel-type Josephson element according to a second embodiment of the present invention.
Figure 5B:
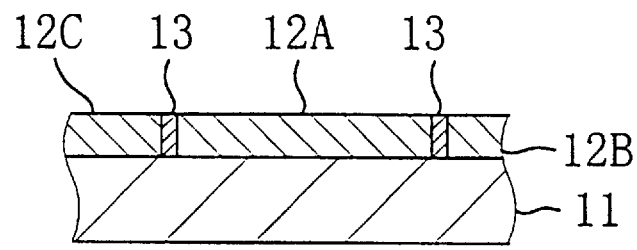
Figure 5C:
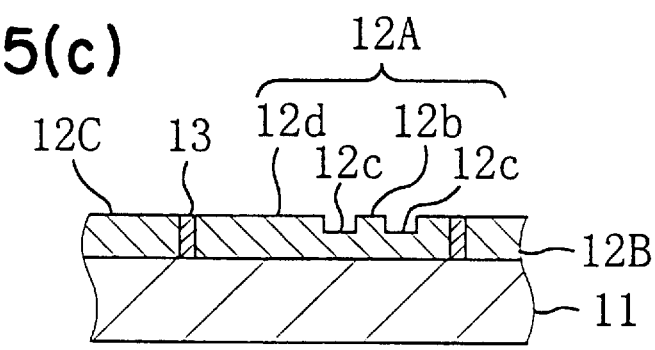
Figure 5D:
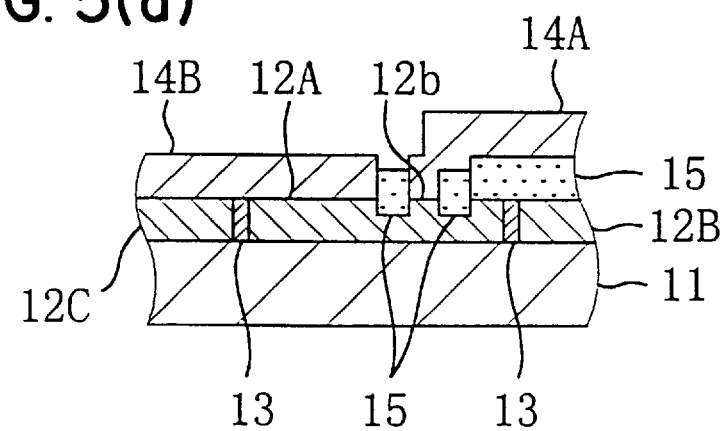

FIG. 4 shows the current-voltage characteristics of the tunnel-type Josephson element manufactured according to the present embodiment, wherein a measuring temperature is 50K. An energy gap which is about four times as much as $2\Delta=40$ meV ($\Delta$ is a superconductive energy gap) is obtained by measurement. It can be understood that four intrinsic Josephson junctions are connected in series.

According to the present embodiment, the thin film 12 made of $Bi_2Sr_2Ca_1Cu_2O_8$ is formed and then heat treated so that the single crystal grains 12A, 12B, 12C, . . . which have great c-axis anisotropy and are made of $Bi_2Sr_2Ca_1CU_2O_8$ are formed in the thin film 12. By setting the c-axis direction of one of the single crystal grains to the current direction, it is possible to obtain a thin film element having excellent element characteristics in which the intrinsic Josephson junction characteristics of the thin film 12 are stably kept.

(Second Embodiment)

A second embodiment of the present invention will be described below with reference to the drawings.

FIGS. 5 (a) to 5 (d) are sectional views showing, in order to steps, a method for manufacturing a tunnel-type Josephson element according to the second embodiment of the present invention. As shown in FIG. 5 (a), a thin film 12 made of $Bi_2Sr_2Ca_1Cu_2O_8$ which has a thickness of about 200 nm is formed on a face (100) of a substrate 11 made of a MgO single crystal at a temperature of 600° C. by using the same method as in the first embodiment.

As shown in FIG. 5 (b), single crystal grains 12A, 12B, 12C, . . . surrounded by a grain boundary 13 are caused to grow in the thin film 12 made of $Bi_2Sr_2Ca_1Cu_2O_8$ respectively by heat treating the thin film 12 for 24 hours at a temperature of 870° C. in an oxygen atmosphere.

As shown in FIG. 5 (c), a frame-shaped concave groove 12c having a width of 2 μm and a depth of 10 nm is formed on the upper face portion of the single crystal grain 12A so that the upper face of the single crystal grain 12A is divided into a first region 12b which is surrounded by the concave groove 12c and has an area of 2 μm×5 μm and a second region 12d which is positioned on the outside of the concave groove 12c.

As shown in FIG. 5 (d), an insulating film 15 made of $CaF_2$ is formed on the concave groove 12c and the predetermined region of the single crystal grain 12A. Then, a first electrode 14A made of Au is formed on the upper face of the first region 12b of the single crystal grain 12A and a second electrode 14B made of Au is formed in the predetermined portion of the second region 12d.

Figure 6:
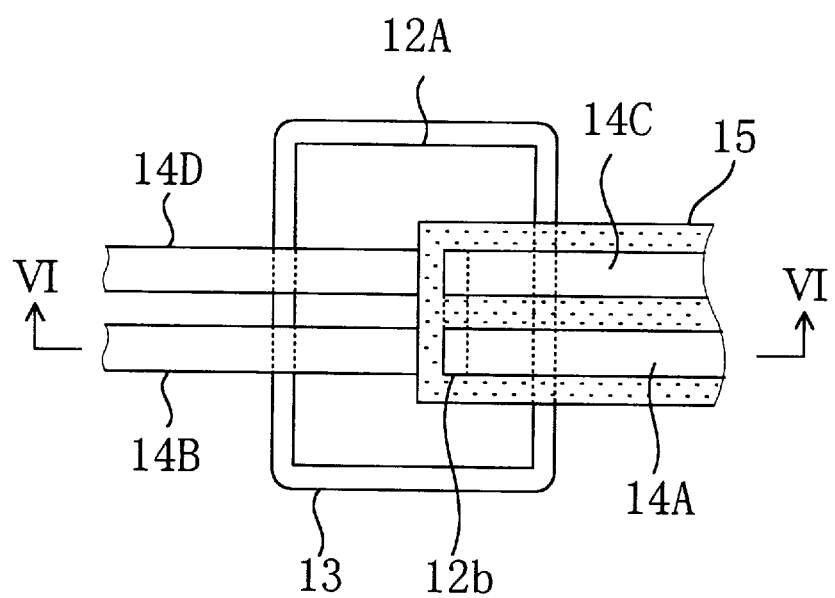
FIG. 6 is a partial plan view showing the tunnel-type Josephson element according to the second embodiment of the present invention.
Figure 7A:
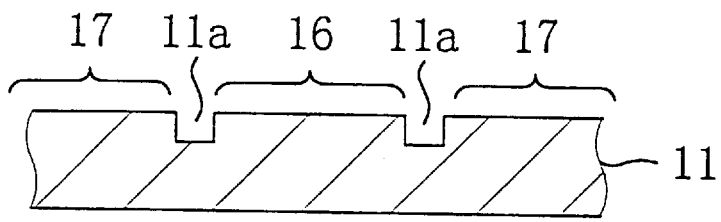
FIGS. 7 (a) to 7 (d) are sectional views showing, in order of steps, a method for manufacturing a tunnel-type Josephson element according to a third embodiment of the present invention.
Figure 7B:
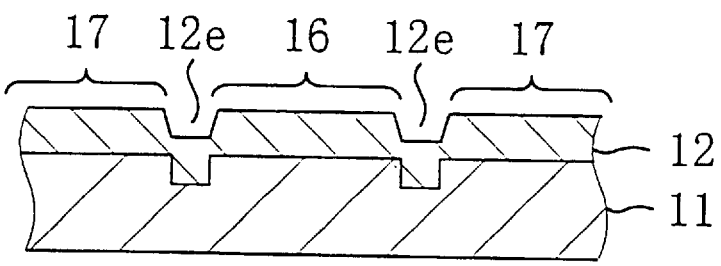
Figure 7C:
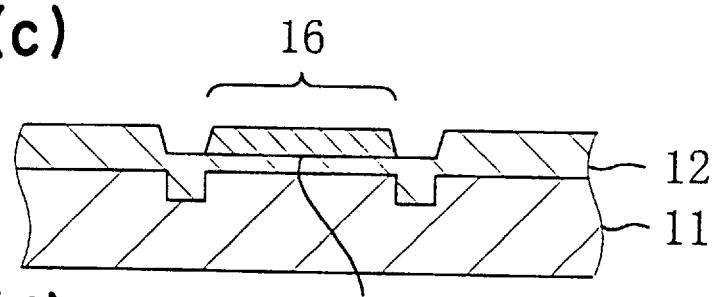
Figure 7D:
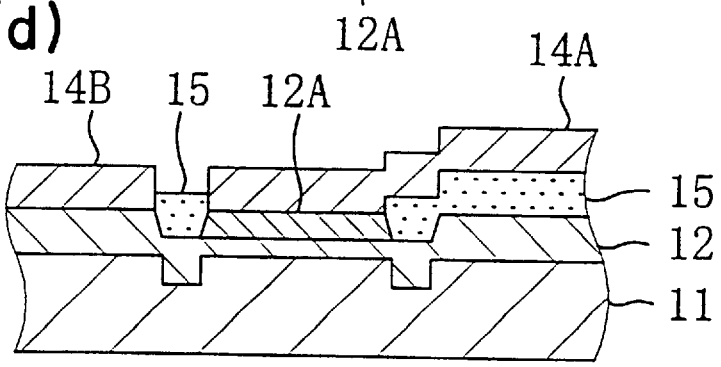

As shown in the partial plan view of FIG. 6, a third electrode 14C which is equivalent to the first electrode 14A and a fourth electrode 14D which is equivalent to the second electrode 14B are formed, respectively. Consequently, 4-terminal measurement can be performed. In FIG. 6, the same reference numerals designate the same or corresponding portions as in FIG. 5 (d). FIG. 5 (d) is a sectional view taken along the line VI—VI in FIG. 6.

As described above, a junction structure formed by an ab face of the second region 12d of the single crystal grain 12A and the second electrode 14B in the c-axis direction which has the sufficient great area has an electric resistance which is much smaller than that of the first region 12b. Consequently, the second electrode 14B is electrically connected to the lower side portion of the first region 12b of the single crystal grain 12A. Therefore, the electric characteristics of the first region 12b in the c-axis direction can be utilized as an element.

The current-voltage characteristics measured at a temperature of 50 K. were the same as those of the first embodiment shown in FIG. 4.

As a feature of the present embodiment, a small amount of etching is enough for the single crystal grain 12A. Consequently, the single crystal grain 12A is less damaged by etching. Thus, stable operation can be performed.

(Third Embodiment)

A third embodiment of the present invention will be described below with reference to the drawings.

FIGS. 7 (a) to 7 (d) are sectional views showing, in order of steps, a method for manufacturing a tunnel-type Josephson element according to the third embodiment of the present invention. As shown in FIG. 7 (a), a first concave groove 11a which has the shape of a plane square, a width of 2 μm and a depth of 10 nm is formed on a main face having a face bearing (100) of a substrate 11 which is made of a MgO single crystal by an argon ion milling method, for example. Consequently, the surface portion of the substrate 11 is divided into a first region 16 which is surrounded by the first concave groove 11a and a second region 17 which is positioned on the outside of the first concave groove 11a. In the present embodiment, the size of the first region 16 is set to 5 μm×10 μm.

As shown in FIG. 7 (b), a thin film 12 made of $Bi_2Sr_2Ca_1Cu_2O_8$ which has a thickness of about 100 nm is formed on the substrate 11 by a radiofrequency magnetron sputtering method using a target which is made of Bi-Sr-Ca-Cu-O having a composition of Bi:Sr:Ca:Cu=2.1:2:1:2 at a substrate temperature of 600° C. In this case, an atmospheric gas is a mixed gas of argon and oxygen. For example, the mixing ratio is $Ar/O_2$=90/10. A gas pressure is 1.0 pa during film formation. The first concave groove 11a is formed on the substrate 11. For this reason, a second concave groove 12e having a depth of 10 nm which corresponds to the first concave groove 11a is also formed on the thin film 12. Consequently, the first region 16 of the thin film 12 is surrounded by the second concave groove 12e.

In the same manner as in the above-mentioned embodiments, the film forming method and the conditions for film formation such as the substrate temperature, the gas ratio, the gas pressure and the like can properly be varied within the range where the composition of the formed thin film 12 approximates $Bi_2Sr_2Ca_1Cu_2O_8$.

As shown in FIG. 7 (c), the thin film 12 was heat treated for 24 hours at a temperature of 860° C. in an oxygen atmosphere. The thin film 12 which had been heat treated was measured by X-ray diffraction. As a result, it was found that the thin film 12 is a c-axis orientation film which is crystallized very highly and includes $Bi_2Sr_2Ca_1Cu_2O_8$ as a main component and $Bi_2Sr_2Cu_1O_6$ as an auxiliary component. Furthermore, it was found, by observation using an atomic force microscope, that the first region 16 of the thin film 12 has a flat surface on which only concavo-convex portions having the unit lattice level are provided. In addition, it was concluded that the first region 16 in the thin film 12 is a single crystal grain 12A made of $Bi_2Sr_2Ca_1Cu_2O_8$ based on the result of energy dispersive type X-ray spectrometry.

Figure 8:
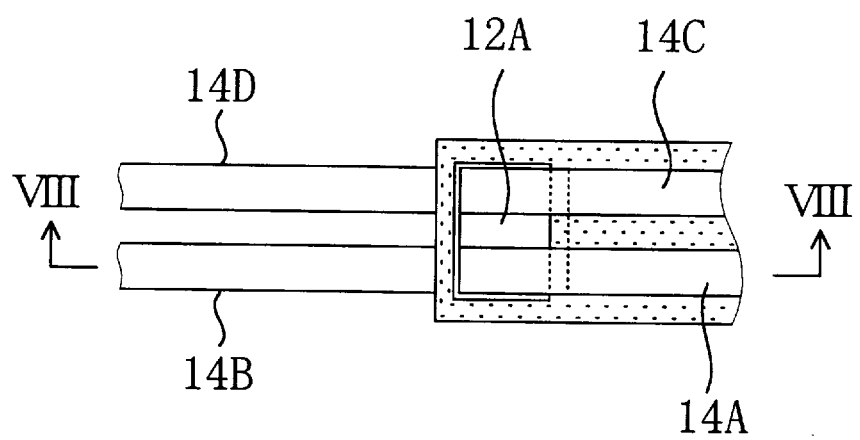
FIG. 8 is a partial plan view showing the tunnel-type Josephson element according to the third embodiment of the present invention.
Figure 9A:
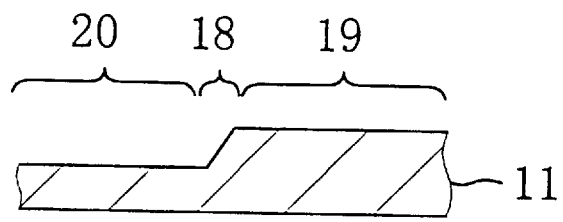
FIGS. 9 (a) to 9 (d) are sectional views showing, in order of steps, a method for manufacturing a tunnel-type Josephson element according to a fourth embodiment of the present invention.
Figure 9B:
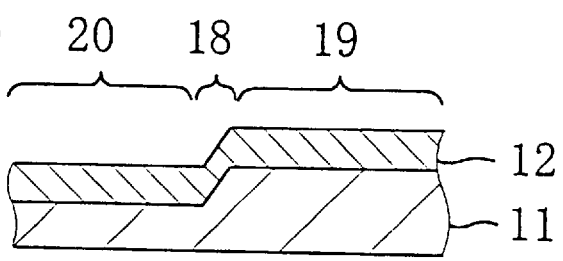
Figure 9C:
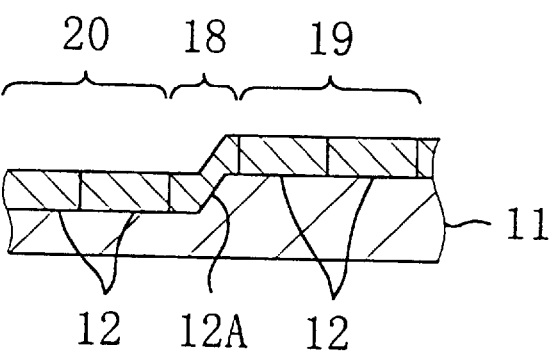
Figure 9D:
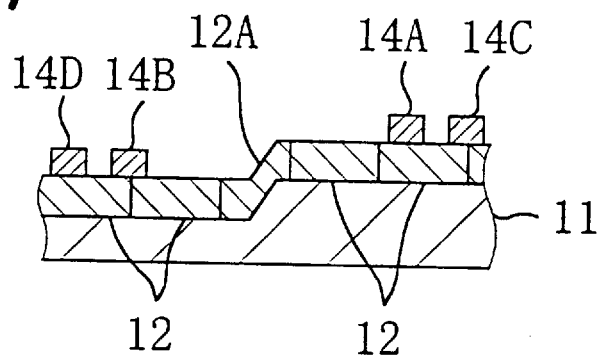

As shown in FIG. 8 and FIG. 7 (d) illustrating a sectional structure taken along the line VIII—VIII in FIG. 8, an insulating film 15 made of $CaF_2$ and first, second, third and fourth electrodes 14A, 14B, 14C and 14D made of Au are formed on the single crystal grain 12A and the predetermined regions of the thin film 12, respectively. Thus, the tunnel-type Josephson element is obtained.

In FIG. 8, the same reference numerals designate the same or corresponding portions as in FIG. 7 (d). The first and third electrodes 14A and 14C are connected to the single crystal grain 12A, and the second and fourth electrodes 14B and 14D are connected to the second region 17 of the thin film 12. The electrode connected to the single crystal grain 12A is divided into the first electrode 14A and the third electrode 14C. The electrode connected to the second region 17 of the thin film 12 is divided into the second electrode 14B and the fourth electrode 14D. Thus, 4-terminal measurement can be performed.

As described above, it is possible to manufacture a tunnel-type Josephson element which utilizes the electric characteristics of the single crystal grain 12 in the c-axis direction as the Josephson effect.

As a feature of the present embodiment, the thin film 12 made of $Bi_2Sr_2Ca_1Cu_2O_8$ is heat treated at a temperature which is equal to or higher than a crystallization temperature so that the first region 16 which is an element formation region partitioned by the second concave grooves 12e of the thin film 12 is made into one single crystal grain made of $Bi_2Sr_2Ca_1Cu_2O_8$ which is oriented in the c-axis direction. Consequently, the single crystal grain 12A having excellent crystalline properties can be formed in the first region 16.

A position in which the single crystal grain 12A is to be formed can be controlled by the concave groove 11a formed on the main face of the substrate 11. Therefore, it is unnecessary to perform the working of specifying the position of the single crystal grain 12A by a stereomicroscope.

The thickness of the thin film 12 is greater than the depth of the concave groove 11a which is formed on the substrate 11. Therefore, a thin film which is formed integrally with the thin film 12 in the second region 17 is present on the lower side of the single crystal grain 12A which is formed in the first region 16. Accordingly, when the second electrode 14B connected to the second region 17 in the thin film 12 is formed, the second electrode 14B is electrically connected to the lower face of the single crystal grain 12A through the second region 17 of the thin film 12 and the lower side portion of the single crystal grain 12A of the thin film 12.

Furthermore, the etching process such as argon ion milling or the like is not necessary for the single crystal grain 12A. Consequently, it is possible to manufacture a tunnel-type Josephson element in high yield.

The current-voltage characteristics obtained at a measuring temperature of 50 K. in the tunnel-type Josephson element manufactured according to the present embodiment were the same as those of the thin film elements obtained in the above-mentioned embodiments.

The thin film elements obtained in the first to third embodiments described above have a structure in which four tunnel-type Josephson junctions are connected in series in the junction portion which acts as a substantial element. More specifically, the thin film elements are obtained by setting the amount of etching for the thin film 12 made of $Bi_2Sr_2Ca_1Cu_2O_8$ equal to or more than four times as much as a space between block layers (BiO layer) in the thin film and less than five times as much as the space between the block layers in the thin film. According to the present invention, it is sufficient that the junction portion which acts as the substantial element includes at least one block layer. The present invention is not restricted to the element structures described in the first to third embodiments. In particular, if the number of the block layers included in the junction portion is equal to or less than 10 as in the elements of the above-mentioned embodiments, an operating voltage can be restricted to about 400 mV or less. Thus, the consumed power of the Josephson element can be reduced.

Each element according to the above-mentioned embodiments has the area of the junction portion (sectional area) set to 2 μm×5 μm or 5 μm×10 μm. In the present invention, it is preferable that the area of the junction portion should be set in such a manner that a voltage value which is obtained when the junction portion jumps to the voltage state can be set equal to or smaller than a tunnel voltage determined by the number of intrinsic Josephson junctions in the junction portion in order to control Joule heat generated in the junction portion. Actually, it is preferable that the area of the junction portion should be set to 400 μm$^2$ or less in consideration of the Joule heat generated in the junction portion.

(Fourth Embodiment)

A fourth embodiment of the present invention will be described below with reference to the drawings.

FIGS. 9 (a) to 9 (d) are sectional views showing, in order of steps, a method for manufacturing a tunnel-type Josephson element according to the fourth embodiment of the present invention. As shown in FIG. 9 (a), a slant portion 18 which has an inclination of 60° with respect to a main face (100) of a substrate 11 made of a MgO single crystal and has a level difference of 200 nm is provided on the main face. The main face of the substrate 11 is divided into a first plane portion 19 and a second plane portion 20 by using the slant portion 18 as a boundary.

As shown in FIG. 9 (b), a thin film 12 made of $Bi_2Sr_2Ca_1Cu_2O_8$ which has a thickness of 150 nm is formed over the whole surface of the substrate 11. As shown in FIG. 9 (c), the thin film 12 is then heat treated for 6 hours at a temperature of 850° C. in an oxygen atmosphere to form a single crystal grain 12A on the slant portion 18 of the thin film 12 and the peripheral portion thereof. As compared with the above-mentioned embodiments, a heat treatment temperature is lower and a time for heat treatment is shorter. The reason is that the growth of the single crystal grain 12A is promoted in the vicinity of the slant portion 18 which is provided on the substrate 11 and the single crystal grain 12A is formed without performing such heat treatment that a grain boundary is definitely generated in the thin film. In the thin film 12, the single crystal grain 12A is connected to the first plane portion 19 and the second plane portion 20 by a superconductor. The first plane portion 19 and the second plane portion 20 are not single-crystallized but becomes superconductors by promoting the single crystallization.

Figure 10:
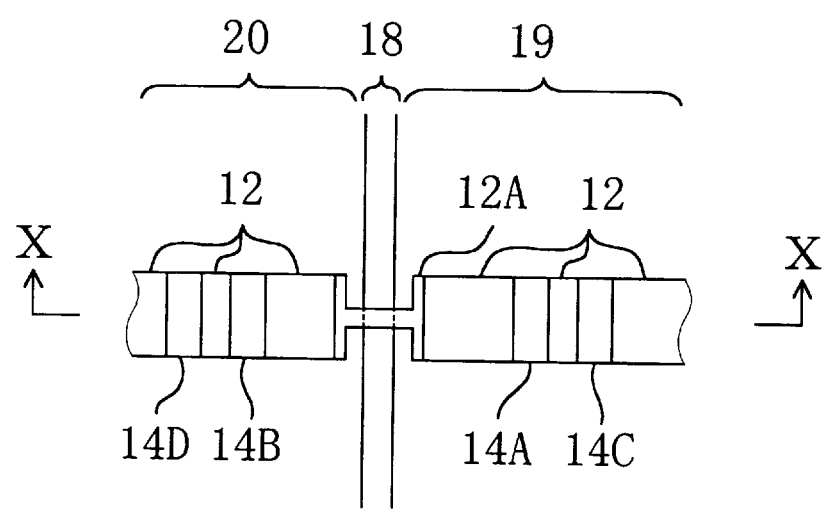
FIG. 10 is a partial plan view showing the tunnel-type Josephson element according to the fourth embodiment of the present invention.
Figure 11A:
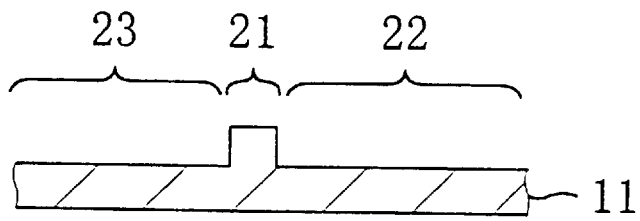
FIGS. 11 (a) to 11 (d) are sectional views showing, in order of steps, a method for manufacturing a tunnel-type Josephson element according to a fifth embodiment of the present invention.
Figure 11B:
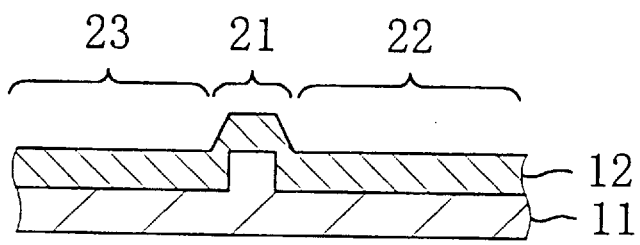
Figure 11C:
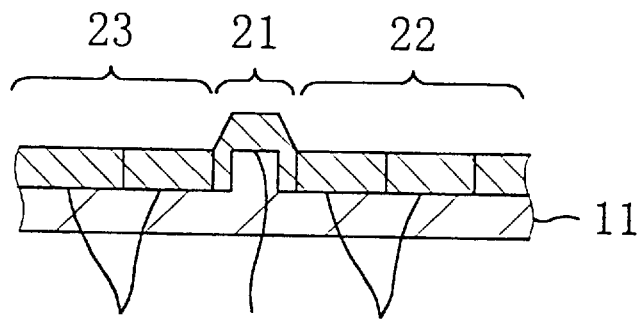
Figure 11D:
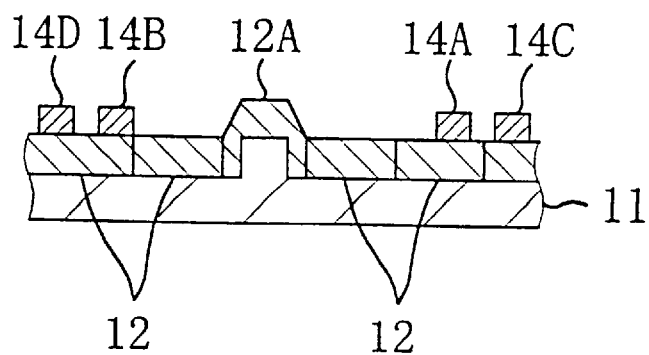

As shown in FIG. 10 and FIG. 9 (d) illustrating a sectional structure taken along the line X—X in FIG. 10, the single crystal grain 12A is etched so as to have a band pattern which is parallel with the direction of inclination of the slant portion 18 in the single crystal grain 12A and has a width of 10 μm or more. The first and second plane portions 19 and 20 are etched so as to have a width of 1 mm in the direction where the slant portion 18 extends. In FIG. 10, the same reference numerals designate the same or corresponding portions as in FIG. 9 (d).

A first electrode 14A and a third electrode 14C which are made of Au are formed on the first plane portion 19 in the thin film 12. A second electrode 14B and a fourth electrode 14D which are made of Au are formed on the second plane portion 20 in the thin film 12. The first plane portion 19 and the second plane portion 20 are electrically connected to the upper and lower faces of the slant portion 18 in the single crystal grain 12A, respectively. While four electrodes are formed in such a manner that 4-terminal measurement can be performed also in the present embodiment, the present invention is not restricted thereto.

If a material which forms the electrode is resistant to heat treatment, the electrode can also be formed prior to the heat treatment.

The current-voltage characteristics obtained at a measuring temperature of 50 K. in the tunnel-type Josephson element manufactured according to the present embodiment were the same as those of the thin film elements obtained in the above-mentioned embodiments.

As a feature of the present embodiment, it is not necessary to perform such heat treatment that a grain boundary is definitely generated in the thin film when forming the single crystal grain in the thin film 12 made of $Bi_2Sr_2Ca_1Cu_2O_8$. Consequently, the element can be manufactured more easily than in the above-mentioned embodiments.

While the height of the slant portion 18 on the substrate 11, that is, the level difference between the first plane portion 19 and the second plane portion 20 has been set to 200 nm and the thickness of the thin film 12 has been set to 150 nm, the present invention is not restricted thereto. If the condition that the height of the slant portion 18 is greater than the thickness of the thin film 12 is met in such a manner that an ab face which penetrates the first plane portion 19 and the second plane portion 20 is not present on the band pattern on the slant portion 18 in the single crystal grain 12A, that is, a current always flows in the band pattern in the c-axis direction, it is possible to obtain an element having the same effects as in the present embodiment.

While the inclination has been set to 60° with respect to the substrate face of the slant portion 18 of the substrate 11 in the present embodiment, the present invention is not restricted thereto. According to the present invention, it is possible to obtain an element having the same effects as in the present embodiment if the inclination of the slant portion 18 is set to a range of 15° to 75°.

While the width of the band pattern on the slant portion 18 in the single crystal grain 12A has been set to 10 μm in the present embodiment, the present invention is not restricted thereto. According to the present invention, it is possible to obtain the same effects as in the present embodiment if the width of the band pattern is set to a range of 1 μm to 100 μm.

(Fifth Embodiment)

A fifth embodiment of the present invention will be described below with reference to the drawings.

FIGS. 11 (a) to 11 (d) are sectional views showing, in order of steps, a method for manufacturing a tunnel-type Josephson element according to the fifth embodiment of the present invention. As shown in FIG. 11 (a), a band-shaped protruding portion 21 having a height of 200 nm and a width of 2 $\mu$m is provided on the main face portion of a substrate 11 made of a MgO single crystal, and the main face of the substrate 11 is divided into a first plane portion 22 and a second plane portion 23 by using the protruding portion 21 as a boundary.

As shown in FIG. 11 (b), a thin film 12 made of $Bi_2Sr_2Ca_1Cu_2O_8$ which has a thickness of 150 nm is formed over the whole surface of the substrate 11. As shown in FIG. 11 (c), the thin film 12 is then heat treated for 6 hours at a temperature of 850° C. in an oxygen atmosphere to form a single crystal grain 12A which is oriented in the c-axis direction on the protruding portion 21 of the thin film 12 and the step portion thereof. In the same manner as in the fourth embodiment, a heat treatment temperature is lower and a time for heat treatment is shorter. If the protruding portion 21 is provided on the substrate 11, the growth of the single crystal grain 12A is promoted in the vicinity of the protruding portion 21. Subsequently, the single crystal grain 12A is etched so as to have a band pattern whose width is 10 $\mu$m in the direction orthogonal to the protruding portion 21 of the single crystal grain 12A. In the thin film 12, the single crystal grain 12A is connected to the first plane portion 22 and the second plane portion 23 through a superconductor. The first plane portion 22 and the second plane portion 23 are not single-crystallized but become superconductors by promoting the single crystallization.

Figure 12:
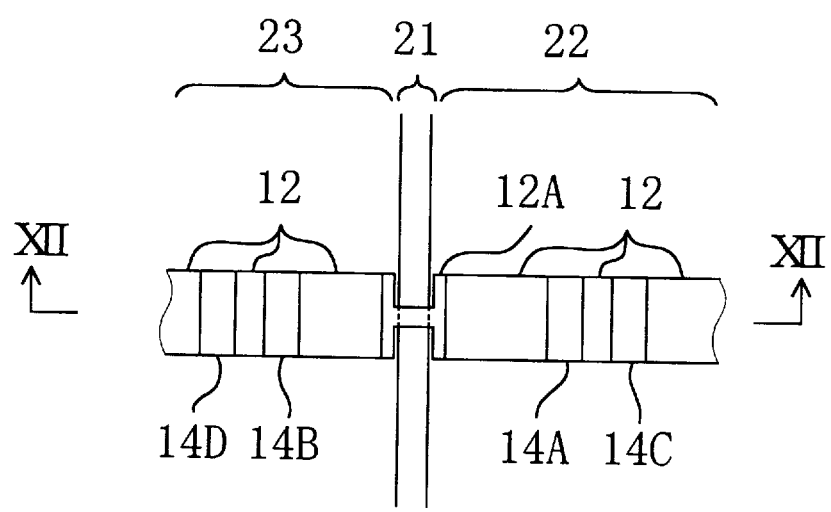
FIG. 12 is a partial plan view showing the tunnel-type Josephson element according to the fifth embodiment of the present invention.
Figure 13A:
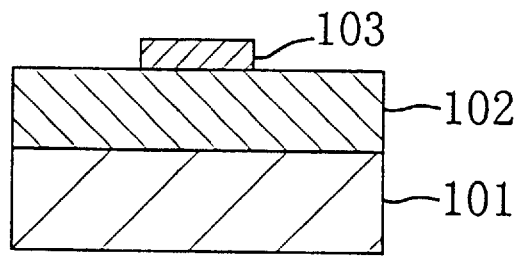
FIGS. 13 (a) to 13 (e) are sectional views showing, in order of steps, a method for manufacturing a tunnel-type Josephson element according to the prior art.
Figure 13B:
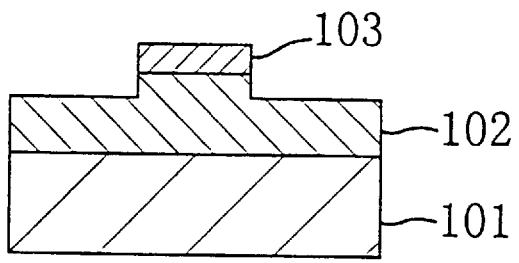
Figure 13C:
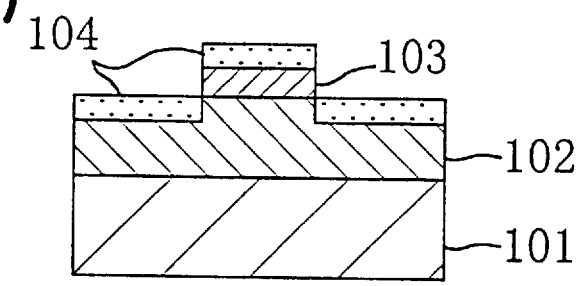
Figure 13D:
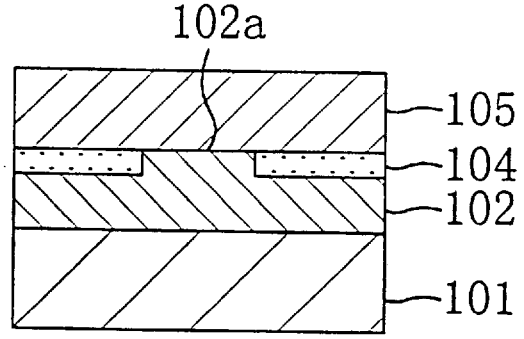
Figure 13E:
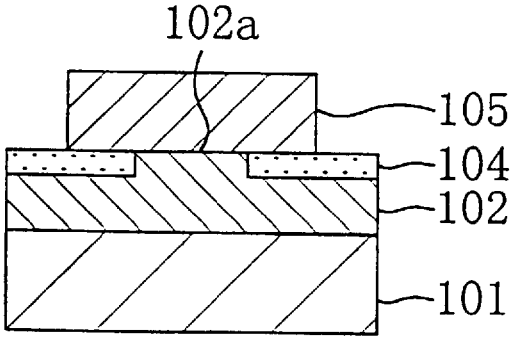
Figure 14A:
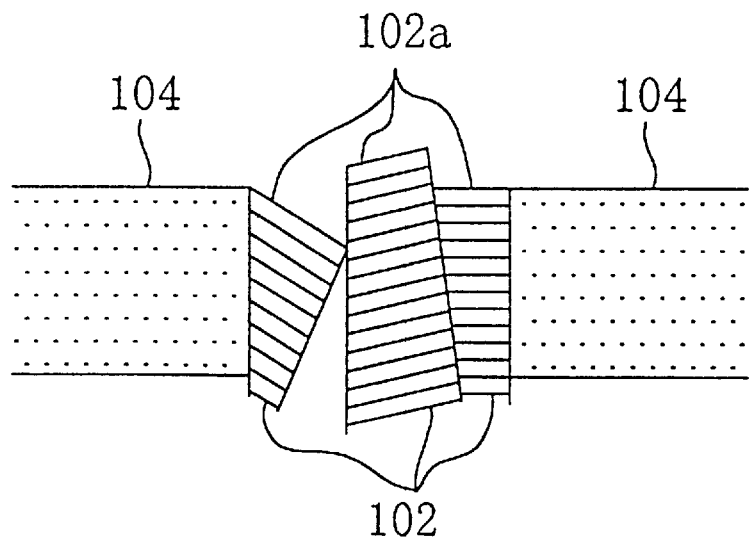
FIGS. 14 (a) and 14 (b) are enlarged views showing the junction region of the tunnel-type Josephson element according to the prior art, wherein FIG. 14 (a) is an enlarged sectional view and FIG. 14 (b) is an enlarged plan view.
Figure 14B:
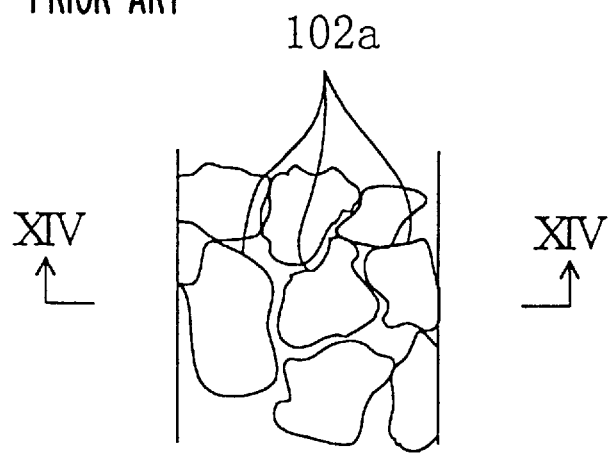

As shown in FIG. 12 and FIG. 11 (d) illustrating a sectional structure taken along the line XII—XII in FIG. 12, a first electrode 14A and a third electrode 14C which are made of Au are formed on the first plane portion 22 in the thin film 12, and a second electrode 14B and a fourth electrode 14D which are made of Au are formed on the second plane portion 23 in the thin film 12. The first plane portion 22 and the second plane portion 23 are electrically connected to both sides of the protruding portion 21 in the single crystal grain 12A, respectively. While four electrodes are formed in such a manner that 4-terminal measurement can be performed also in the present embodiment, the present invention is not restricted thereto. In FIG. 12, the same reference numerals designate the same or corresponding portions as in FIG. 11 (d).

If a material which forms the electrode is resistant to heat treatment, the electrode can also be formed prior to the heat treatment.

The current-voltage characteristics obtained at a measuring temperature of 50 K. in the tunnel-type Josephson element manufactured according to the present embodiment were the same as those of the thin film elements obtained in the above-mentioned embodiments.

As a feature of the present embodiment, it is not necessary to perform such heat treatment that a grain boundary is definitely generated in the thin film when forming the single crystal grain 12A in the thin film 12 made of $Bi_2Sr_2Ca_1Cu_2O_8$ because the band-shaped protruding portion 21 promotes the single crystallization of the thin film 12. Consequently, the element can be manufactured more easily.

While the width of the band-shaped protruding portion 21 has been set to 2 $\mu$m in the present embodiment, the present invention is not restricted thereto. In other words, it is sufficient that the width of the protruding portion 21 is regulated depending on the size of the single crystal grain 12A, that is, the conditions of the heat treatment step.

While the height of the band-shaped protruding portion 21 has been set to 200 nm and the thickness of the thin film 12 made of $Bi_2Sr_2Ca_1Cu_2O_8$ has been set to 150 nm in the present embodiment, the present invention is not restricted thereto. If the condition that the height of the protruding portion 21 is greater than the thickness of the thin film 12 is met in such a manner that an ab face which penetrates the first plane portion 22 and the second plane portion 23 is not present on the band pattern on the protruding portion 21 in the single crystal grain 12A, that is, a current always flows in the band pattern in the c-axis direction, it is possible to obtain an element having the same effects as in the present embodiment.

While the width of a portion which is orthogonal to the protruding portion 21 of the single crystal grain 12A has been set to 10 $\mu$m in the present embodiment, the present invention is not restricted thereto. According to the present invention, it is possible to obtain an element having the same effects as in the present embodiment if the width of the portion which is orthogonal to the protruding portion 21 of the single crystal grain 12A is set to a range of 1 $\mu$m to 100 $\mu$m.

In the elements obtained according to the fourth and fifth embodiments, it is difficult to specify the area of the band-shaped junction portion and the number of intrinsic Josephson junctions in the junction portion. However, these elements have the same characteristics as those of the elements obtained in the first to third embodiments. Consequently, it is supposed that the elements according to the fourth and fifth embodiments form the same tunnel-type Josephson elements as those of the first to third embodiments.

While the thin film made of $Bi_2Sr_2Ca_1Cu_2O_8$ has been used as the oxide high-temperature superconductor film in each embodiment, the present invention is not restricted thereto. Also in the case where oxide high-temperature superconductor films having other compositions are used, the same effects can be obtained. In particular, oxide high-temperature superconductors made of $Bi_2Sr_2Ca_2Cu_3O_{10}$ and $(Bi, Pb)_2Sr_2Ca_2Cu_3O_{10}$ which contains Pb have a higher superconductive critical temperature than that of the oxide high-temperature superconductor made of $Bi_2Sr_2Ca_1Cu_2O_8$. Accordingly, in the case where these thin films are used, the element can be operated at a liquid nitrogen temperature of 77 K. or more. A T1 based oxide high-temperature superconductor which has a double block layer in a crystalline structure thereof is useful in operating the element at a high temperature because the superconductive critical temperature is higher than that of the Bi based oxide high-temperature superconductor having the same crystalline structure.

While the single crystal grain has been oriented in the c-axis direction with respect to the substrate in the above-mentioned embodiments, the present invention is not restricted thereto. More specifically, if the single crystal grain has the definite orientation direction, the same effects can be obtained.

While the MgO single crystal has been used for the substrate and the $Bi_2Sr_2Ca_1Cu_2O_8$ film has been formed on the face (100) of the MgO single crystal in the above-mentioned embodiments, the present invention is not restricted thereto. According to the present invention, also in the case where a face (100) made of a $SrTiO_3$ single crystal, a face (100) made of a $LaAlO_3$ single crystal or a face (001) made of a $NdGaO_3$ single crystal is used for the substrate so as to form an oxide high-temperature superconductive film on the crystal face thereof, the same effects can be obtained. In this case, the mismatch of a lattice constant is reduced more than in the case where the face (100) of the MgO single crystal is used. Therefore, it is expected that the diameter of the single crystal grain which is formed in the thin film is increased. Thus, it is also possible to manufacture a plurality of elements on a single crystal grain.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

We claim:

1. A method for manufacturing a tunnel-type Josephson element, comprising the steps of:

forming a thin film made of an oxide high-temperature superconductor on the main face of a substrate;

forming a single crystal grain which is made of the oxide high-temperature superconductor and has the c-axis orientation by heat treating the thin film at a temperature that is equal to or higher than the crystallization temperature of the oxide high-temperature superconductor;

forming a first electrode which is electrically connected to the single crystal grain in a region on the upper face of the thin film; and forming a second electrode which is electrically connected to the single crystal grain in the other region on the upper face of the thin film.

2. A method for manufacturing a tunnel-type Josephson element, comprising the steps of;

forming a thin film made of an oxide high-temperature superconductor on the main face of a substrate;

forming a first electrode in a region on the upper face of the thin film;

forming a second electrode in the other region on the upper face of the thin film; and forming a single crystal grain which is made of the oxide high-temperature superconductor and has the c-axis orientation by heat treating the thin film at a temperature that is equal to or higher than the crystallization temperature of the oxide high-temperature superconductor.

3. The method for manufacturing a tunnel-type Josephson element of claim 1, further comprising, between the single crystal grain forming step and the first electrode forming step, the step of forming a convex portion made of a predetermined region on the upper face portion of the single crystal grain by removing a region other than the predetermined region on the upper face portion of the single crystal grain to a predetermined depth with respect to the main face of the substrate, wherein the first electrode forming step includes the step of forming the first electrode on the upper face of the convex portion of the single crystal grain, and wherein the second electrode forming step includes the step of forming the second electrode in a region other than the convex portion of the single crystal grain.

4. The method for manufacturing a tunnel-type Josephson element of claim 3, wherein the upper face of the convex portion of the single crystal grain has an area of 400 $\mu m^2$ or less.

5. The method for manufacturing a tunnel-type Josephson element of claim 3, wherein the height of the convex portion of the single crystal grain is equal to or less than 10 times as much as a space between block layers of the oxide high-temperature superconductor formed at the superconductor thin film forming step.

6. The method for manufacturing a tunnel-type Josephson element of claim 1, further comprising, between the single crystal grain forming step and the first electrode forming step, the step of forming a frame-shaped concave groove having a predetermined depth on the upper face portion of the single crystal grain to divide the upper face of the single crystal grain into a first region surrounded by the concave groove and a second region on the outside of the concave groove, wherein the first electrode forming step includes the step of forming the first electrode in the first region of the single crystal grain, and wherein the second electrode forming step includes the step of forming the second electrode in the second region of the single crystal grain.

7. The method for manufacturing a tunnel-type Josephson element of claim 6, wherein the first region of the single crystal grain has an area of 400 $\mu m^2$ or less.

8. The method for manufacturing a tunnel-type Josephson element of claim 6, wherein the predetermined depth of the concave groove of the single crystal grain is equal to or less than 10 times as much as the space between the block layers of the oxide high-temperature superconductor formed at the superconductor thin film forming step.

9. The method for manufacturing a tunnel-type Josephson element of claim 1 or 2, further comprising, prior to the superconductor thin film forming step, the step of forming a frame-shaped concave groove having a predetermined depth on the main face portion of the substrate to divide the main face portion of the substrate into a first region surrounded by the concave groove and a second region on the outside of the concave groove, wherein the superconductor thin film forming step includes the step of forming, over the whole main face of the substrate, a thin film made of an oxide high-temperature superconductor having a thickness which is greater than the predetermined depth of the concave groove, wherein the first electrode forming step includes the step of forming the first electrode in the upper side portion of the first region of the substrate in the thin film, and wherein the second electrode forming step includes the step of forming the second electrode in the upper side portion of the second region of the substrate in the thin film.

10. The method for manufacturing a tunnel-type Josephson element of claim 9, wherein the upper side portion of the first region of the substrate in the thin film has an area of 400 $\mu m^2$ or less.

11. The method for manufacturing a tunnel-type Josephson element of claim 9, wherein the predetermined depth of the concave groove of the thin film is equal to or less than 10 times as much as the space between the block layers of the oxide high-temperature superconductor formed at the superconductor thin film forming step.

12. The method for manufacturing a tunnel-type Josephson element of claim 1 or 2, further comprising, prior to the superconductor thin film forming step, the step of forming a slant portion which divides the main face portion of the substrate into a first plane portion and a second plane portion, has an angle of 15° to 75° to the main face of the substrate between the first and second plane portions, and connects the first and second plane portions, wherein the superconductor thin film forming step includes the step of forming, over the whole main face of the substrate, a thin film made of an oxide high-temperature superconductor which has a thickness that is smaller than the height of the slant portion, wherein the single crystal grain forming step includes the step of forming the single crystal grain in a region having the upper side portion of the slant portion of the substrate in the thin film, and then forming a band-shaped portion made of the single crystal grain on the slant portion of the single crystal grain in the direction of inclination of the slant portion, wherein the first electrode forming step includes the step of forming, on the first plane portion, the first electrode which is electrically connected to the first plane portion in the single crystal grain, and wherein the second electrode forming step includes the step of forming, on the second plane portion, the second electrode which is electrically connected to the second plane portion in the single crystal grain.

13. The method for manufacturing a tunnel-type Josephson element of claim 1 or 2, further comprising, prior to the superconductor thin film forming step, the step of forming a protruding portion which divides the main face portion of the substrate into a first plane portion and a second plane portion, and partitions the first and second plane portions between the first and second plane portions, wherein the superconductor thin film forming step includes the step of forming, over the whole main face of the substrate, a thin film made of an oxide high-temperature superconductor which has a thickness that is smaller than the height of the protruding portion, wherein the single crystal grain forming step includes the step of forming the single crystal grain in a region having the protruding portion on the main face of the substrate, and then forming a band-shaped portion made of the single crystal grain in a region located across the protruding portion in the single crystal grain, wherein the first electrode forming step includes the step of forming, on the first plane portion, the first electrode which is electrically connected to the first plane portion in the single crystal grain, and wherein the second electrode forming step includes the step of forming, on the second plane portion, the second electrode which is electrically connected to the second plane portion in the single crystal grain.

14. The method for manufacturing a tunnel-type Josephson element of claim 1 or 2, wherein the oxide high-temperature superconductor at the superconductor thin film forming step is a compound which contains Bi (bismuth), Sr (strontium), Ca (calcium), Cu (copper) and O (oxygen).

* * * * *